US010605868B2

United States Patent
Bamberger et al.

(10) Patent No.: US 10,605,868 B2
(45) Date of Patent: Mar. 31, 2020

(54) PERFORMANCE TRACKING OF AN ELECTRICAL ENERGY STORAGE SYSTEM

(71) Applicant: Siemens Aktiengesellschaft, München (DE)

(72) Inventors: Joachim Bamberger, München (DE); Stefan Jessenberger, Möhrendorf (DE); Spartak Rasov, Erlangen (DE); Jeremy Ralph Wiles, Gräfenberg (DE); Philipp Wolfrum, München (DE)

(73) Assignee: SIEMENS AKTIENGESELLSCHAFT, Federal Republic, Munich (DE)

( * ) Notice: Subject to any disclaimer, the term of this patent is extended or adjusted under 35 U.S.C. 154(b) by 410 days.

(21) Appl. No.: 15/303,766

(22) PCT Filed: Apr. 14, 2015

(86) PCT No.: PCT/US2015/025662
§ 371 (c)(1),
(2) Date: Oct. 13, 2016

(87) PCT Pub. No.: WO2015/160745
PCT Pub. Date: Oct. 22, 2015

(65) Prior Publication Data
US 2017/0038432 A1    Feb. 9, 2017

Related U.S. Application Data

(60) Provisional application No. 61/980,152, filed on Apr. 16, 2014.

(51) Int. Cl.
G01R 31/36    (2020.01)
H01M 10/48    (2006.01)
(Continued)

(52) U.S. Cl.
CPC ......... *G01R 31/367* (2019.01); *G01R 31/382* (2019.01); *G01R 31/389* (2019.01);
(Continued)

(58) Field of Classification Search
CPC ............ G01R 31/3651; G01R 31/3662; G01R 31/3679; G01R 31/3606; H01M 10/482; H01M 10/42; H01M 10/48
See application file for complete search history.

(56) References Cited

U.S. PATENT DOCUMENTS

5,479,358 A * 12/1995 Shimoda ............ G05D 23/1902
                                                            307/126
8,101,293 B2    1/2012 Chan et al.
(Continued)

FOREIGN PATENT DOCUMENTS

EP    2581754 A2    4/2013
EP    3132274 A2    2/2017
(Continued)

OTHER PUBLICATIONS

PCT International Search Report and Written Opinion dated Jul. 24, 2015 corresponding to PCT Application PCT/US2015/025662 filed Apr. 14, 2015. (12 pages).

*Primary Examiner* — Mohamed Charioui
*Assistant Examiner* — Jeremy A Delozier

(57) ABSTRACT

A method for predicting a performance of an electrical energy storage system includes receiving, as input, time series of data points pertaining to a plurality of operational parameters of the electrical energy storage system. The input time series is provided to a model that simulates dynamics of the electrical energy storage system. A plurality of performance indicators of the electrical energy storage system may be calculated based on the simulated dynamics of the electrical energy storage system.

2 Claims, 2 Drawing Sheets

(51) Int. Cl.
*G01R 31/367* (2019.01)
*G01R 31/382* (2019.01)
*G01R 31/389* (2019.01)
*G01R 31/392* (2019.01)
*H01M 10/42* (2006.01)
*H01G 11/14* (2013.01)

(52) U.S. Cl.
CPC .......... *G01R 31/392* (2019.01); *H01M 10/42* (2013.01); *H01M 10/482* (2013.01); *H01G 11/14* (2013.01); *H01M 10/48* (2013.01)

(56) References Cited

U.S. PATENT DOCUMENTS

| | | | |
|---|---|---|---|
| 8,332,342 | B1 | 12/2012 | Saha et al. |
| 2001/0035739 | A1 | 11/2001 | Laig-Horstebrock et al. |
| 2005/0007074 | A1 | 1/2005 | Koster |
| 2009/0306915 | A1* | 12/2009 | Schoch .............. G01R 31/3651 702/63 |
| 2013/0090900 | A1 | 4/2013 | Gering |
| 2013/0110429 | A1* | 5/2013 | Mitsuyama ........... H01M 10/48 702/63 |
| 2013/0198541 | A1 | 8/2013 | Rabii |
| 2014/0032141 | A1 | 1/2014 | Subbotin et al. |
| 2014/0304025 | A1* | 10/2014 | Steven ............. G06Q 10/06314 705/7.24 |
| 2015/0112620 | A1* | 4/2015 | Konig ................ B60L 11/1861 702/63 |
| 2017/0038432 | A1 | 2/2017 | Bamberger et al. |

FOREIGN PATENT DOCUMENTS

| | | |
|---|---|---|
| WO | 2006010659 A1 | 2/2006 |
| WO | 2006054066 A1 | 5/2006 |

\* cited by examiner

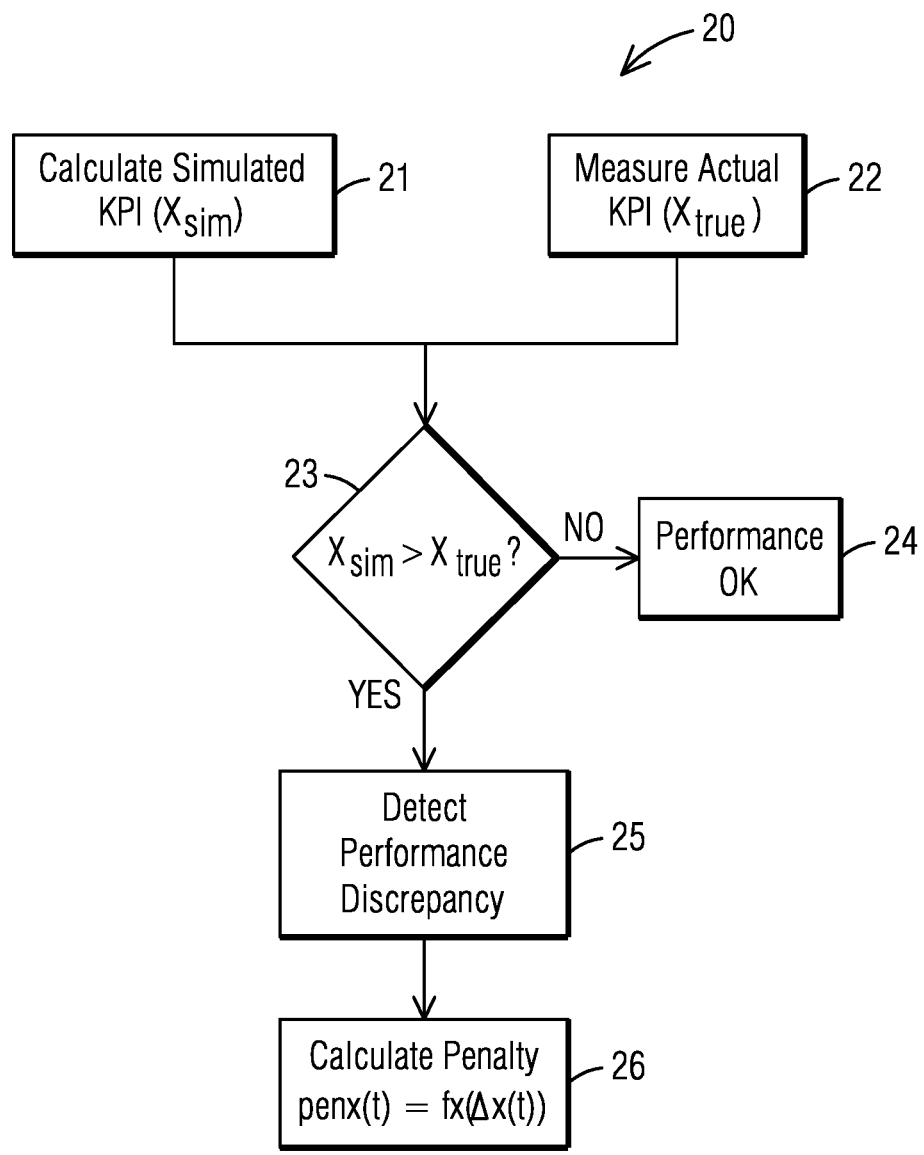

PERFORMANCE TRACKING OF AN ELECTRICAL ENERGY STORAGE SYSTEM

CROSS REFERENCE TO RELATED APPLICATIONS

This application claims priority to the U.S. provisional application No. 61/980,152 filed Apr. 16, 2014, which is incorporated by reference herein in its entirety.

BACKGROUND

1. Field

The present invention relates to electrical storage systems, such as batteries.

Embodiments of the present invention illustrated herein relate to prediction as well as to tracking of performance of an electrical energy storage system.

2. Description of the Related Art

The usefulness of electrical energy storage systems (ESS), for example, comprising one or more batteries may depend on certain specified properties, referred to as key performance indicators (KPI). An example of a KPI for an ESS is its energy capacity, simply referred to as "capacity" in this text. A KPI such as capacity typically varies significantly during the lifetime of the ESS, and the variation may depend on several factors.

Therefore, a supplier of an ESS often cannot guarantee a single value that a KPI would retain over its whole lifecycle. A customer or consumer, on the other hand, needs a certain expectation of how the performance of his ESS will evolve over the lifecycle to assess the value of this asset. Consequently, there may be a need for a method that enables a supplier to guarantee a customer exactly how a KPI of an ESS will evolve over its lifetime.

Due to the complex temporal evolution of the KPIs and current ESS products typically being relatively young and not mass tested, suppliers often do not provide any KPI guarantees at all. Alternately, some of the approaches that have been used by ESS suppliers include, for example:

KPI guarantees if very strict usage regimes are followed, or

Guarantees describing evolution of a KPI as a relatively simple function of lifetime.

The state of the art approaches may have the disadvantage that they will usually predict a KPI very conservatively, which can lead to suboptimal investment decision and planning. Sometimes prediction of temporal evolution of the KPI is almost impossible if they depend strongly on usage history.

SUMMARY

An object of the invention is to provide a model based approach to predicting a performance of an electrical energy storage system.

Another object of the invention is to provide an improved method for tracking the performance of an electrical energy storage system.

Yet another object of the invention is to provide an improved performance guarantee to a consumer of an electrical energy storage system.

The above objects are achieved by the features of the independent claims.

According to one aspect, a method for predicting a performance of an electrical energy storage system is provided. The method includes receiving, as input, time series of data points pertaining to a plurality of operational parameters of the electrical energy storage system, providing the input time series to a model that simulates dynamics of the electrical energy storage system, and calculating a plurality of performance indicators of the electrical energy storage system based on the simulated dynamics of the electrical energy storage system.

The proposed method uses a plurality of input operational parameters that lead to an accurate simulation of the dynamics of the electrical energy storage system. As a consequence the performance indicators may be predicted better than with a model free approach.

The proposed method, being based on a simulation model, also allows more performance indicators to be predicted than with state of the art methods. This may also include certain performance indicators that depend on usage in a complicated fashion, which were hitherto impossible to accurately predict. The model based approach also provides for less restricted usage and actually allows any technically sensible usage of the electrical energy storage system, since the simulation model is able to predict performance indicators for potentially many possible usage scenarios.

According to another aspect, a method of tracking a performance of an electrical energy storage device is provided. The method essentially uses the above mentioned model based approach for calculating predicted values of performance indicators, and compares these predicted values to actual or test values of these performance indicators obtained from actual usage of the electrical energy storage system to determine any discrepancy in performance of the electrical energy storage system with respect to that predicted by the simulation model.

According to yet another aspect, a method for servicing a consumer of an electrical energy storage system is provided. The method includes providing a performance guarantee on the electrical energy storage system, wherein the performance guarantee is based on performance indicators predicted by the above described simulation model of the electrical energy storage system. The above approach is capable of providing guarantees on a large number of performance indicators compared to the state of the art, including those that depend on usage in a complicated manner. Furthermore, the model based approach provides less conservative guarantees of the performance indicators and allows the consumer a wide range of usages, since the simulation model is capable of predicting performance indicators for a large number of usage scenarios. A more optimal usage of the

BRIEF DESCRIPTION OF THE DRAWINGS

The invention is shown in more detail by help of figures. The figures show preferred configurations and do not limit the scope of the invention.

FIG. 3 is a flowchart illustrating an exemplary method for tracking performance of an electrical energy storage system.

DETAILED DESCRIPTION

Figure 1:
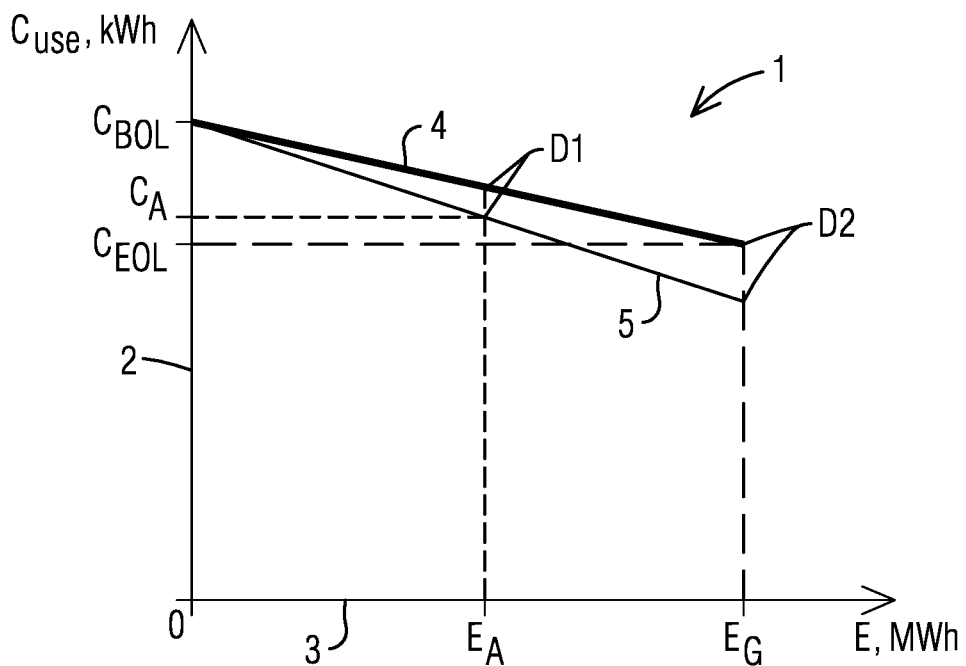
FIG. 1 is a graphical illustration of an exemplary variation of capacity as a function of energy throughput of an electrical energy storage system.

In the context of the present discussion, the following definitions may be applicable:

A "performance indicator" refers to a property of the ESS that indicates usefulness and/or performance of the ESS. In this discussion, the term "performance indicator" is also interchangeably referred to as key performance indicator or simply KPI. Non limiting examples of KPIs, as used in the illustrated embodiments, include energy capacity, maximum power, efficiency, losses, among others.

An "operational parameter" refers to a variable that indicates an operating condition of an ESS and/or influences an operating state of the ESS. Non limiting examples of operational parameters as used in the illustrated embodiments include input power, ambient or environmental temperature, among others.

The term "capacity" refers to the energy capacity, or more specifically, the usable energy capacity of the ESS, and may be expressed in energy units, e.g. kWh, MWh, etc.

The term "energy throughput" for a given point in time in the lifetime of an ESS refers to the total of the energy charged into and energy discharged from the ESS, from the beginning of life of the ESS up to said point in time. Energy throughput may be expressed in energy units e.g. kWh, MWh, etc.

"Maximum power" of the ESS may either refer to a maximum discharge power or a maximum charge power of the ESS. The maximum discharge power is the maximum rate at which the ESS is able to discharge energy. The maximum charge power is the maximum rate at which the ESS may be charged with energy.

The term "loss" may refer to power losses inside ESS components such as power conversion system (PCS), transformers, battery system, cable, etc. and/or to power losses due to ESS auxiliaries such as HVAC, internal lighting, etc.

The "efficiency" of an ESS refers to the ratio between the total energy released by the ESS during a discharge mode and the total energy taken up by the ESS during a charge mode.

"State of charge" or SOC is a state of an ESS and refers to a measure of energy stored by the ESS as a fraction of its energy capacity. It may be expressed as a percentage, e.g., 0%="empty", 100%="full".

"Depth of discharge" or DoD may refer to an inverse of the SOC and may be also expressed as a percentage, e.g., 0%="full", 100%="empty".

"State of Health" or SOH is an indicator of age of an ESS. SOH is defined as 1 when the ESS is new and 0 when the ESS has aged so much that it needs to be replaced. In the illustrated embodiments, properties of the ESS that are affected by aging (e.g. capacity and internal resistance) may be expressed as a function of SOH.

Due to the complex temporal evolution of the KPIs and current ESS products typically being relatively young and not mass tested, suppliers of ESS are often not able to provide KPI guarantees at all, or if at all, those KPI guarantees are based on very strict usage regimes are followed.

Alternately it may be possible to provide a performance guarantee that describes evolution of a KPI as a relatively simple function of lifetime.

FIG. 1 shows an exemplary graph 1 illustrating an evolution of KPI with a lifetime parameter. In this example, the KPI shown is usable energy capacity ($C_{use}$), represented along the axis 2, and the lifetime parameter is energy throughput (E), represented along the axis 3. The curve 4 in this example is the guaranteed curve of the ESS usable energy capacity as a function of the total energy throughput. That is to say, the curve 4 describing the evolution of a KPI (capacity) over lifetime may be part of a guarantee agreement between a supplier and a consumer of the ESS. The quantity $C_{BOL}$ represents the usable energy capacity of the ESS at the beginning of life, while the quantity $C_{EOL}$ represents the usable energy capacity of the ESS at the end of its life. $C_{EOL}$ may, for example, be expressed as a fraction or percentage of $C_{BOL}$ by the supplier provided guarantee. The quantity $E_G$ represents the guaranteed throughput.

On the other hand, the curve 5 is an example of an actual measured curve of ESS usable energy capacity as a function of total energy throughput. Herein, the quantity $C_A$ represents an actual ESS usable energy capacity verified during a test, while the quantity $E_A$ represents an actual energy throughput during the test. As seen from this example, the actual measured curve 5 may not match up to the guaranteed curve 4. In this case, the actual behavior of the ESS exhibits a difference $D_1$ with the guaranteed curve 4, which is the difference between guaranteed capacity and the actual measured capacity during the test. Likewise, the actual behavior of the ESS also exhibits a difference $D_2$ with the guaranteed curve 4, which is the difference between guaranteed capacity and the actual measured capacity at the end of life of the ESS.

As seen, the above approach describes a linear one-to-one relationship between a KPI, i.e., capacity, and energy throughput. Such an approach is simplistic and may predict a KPI very conservatively, which can lead to suboptimal investment decision and planning.

The embodiments described hereinafter provide a mechanism for predicting a performance of an ESS that is based on a simulation model of the ESS. The ESS may comprise, for example, one or more batteries. In an example embodiment, the simulation model may be part of a guarantee agreement between an ESS supplier and a consumer. In a further embodiment, the simulation based model may be used for performance tracking of an ESS.

Figure 2:
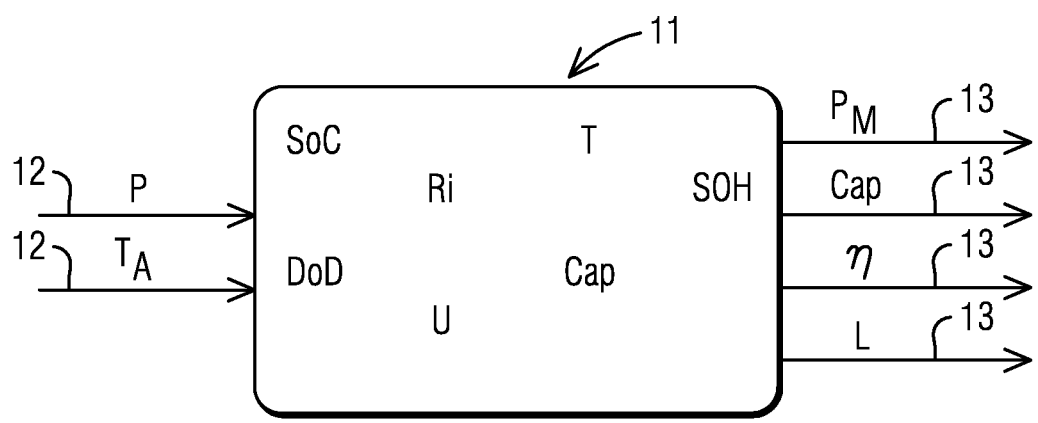
FIG. 2 is a schematic block diagram illustrating a model for dynamically simulating an electrical energy storage system with defined inputs and outputs.

FIG. 2 is a schematic block diagram illustrating a model 11 for dynamically simulating an ESS in accordance with one embodiment. The model 11 has well defined input interfaces 12 and output interfaces 13. The model 11 works by receiving an input, via input interfaces 12, time series of data points pertaining to a multiplicity of operational parameters of the ESS. As defined previously, the operational parameters pertain to usage conditions of the ESS. In the illustrated example, the operational parameters utilized are input power P and ambient or environmental temperature $T_A$.

In one embodiment, the input time series may be obtained from measurement of operational parameters during actual operation of the ESS, for example during a test for performance tracking. Alternately, the input time series may be obtained from an archive of measured values of operational parameters of the ESS. In yet another embodiment, the input time series may be obtained from hypothetical values of operational parameters, for example, for predicting the ESS performance for a hypothetical usage scenario. In one embodiment, when incorporating the model in a guarantee agreement, exact definitions and sampling rate of the input time series provided to the model may be part of the contractual agreement between the ESS supplier and consumer.

The input time series is fed to the model 11 that simulates dynamics of the ESS. Based on the simulated dynamics of the ESS, the model determines a multiplicity of KPIs describing battery performance, which are provided to the output interface 13.

In the illustrated embodiment, the model 11 functions by utilizing the input time series of operational parameters to dynamically simulate one or more states of the ESS. For example, the one or more dynamically simulated states may include, state of charge (SOC), state of health (SOH), internal temperature (T), capacity (Cap), voltage (U), depth of discharge (DoD), internal resistance or impedance (Ri), or combinations thereof. In an exemplary embodiment, the dynamically simulated states may be determined mathematically from the input time series, based on defined model parameters, for example using algebraic equations and/or differential equations and/or lookup tables. Examples of model parameters that may be utilized in the simulation include, but are not limited to: nominal capacity of the ESS, or resting voltage, or size of the ESS, or nominal internal resistance of the ESS, or heat capacity of the ESS, or parameters describing speed of capacitive aging, or any subset of the above mentioned list of parameters.

The KPIs are determined from the dynamically simulated ESS states and provided to the output interface 13. In the illustrated embodiment, the KPIs output by the model 11 include energy capacity (Cap), efficiency ($\eta$), losses (L) and maximum power ($P_M$). The model 11 may be used for calculating alternate or additional KPIs, such as, energy content that can be discharged, among others. The model 11 may also be configured to calculate a smaller number or any subset of the mentioned list of KPIs.

The KPIs may be determined directly or indirectly from the dynamically simulated ESS states. In certain cases, a KPI, for example energy capacity, may correspond directly to a simulated state (Cap), and therefore be directly output based on the simulated state (Cap). Other KPIs may be calculated based on defined relationships between said KPIs and one or more of the dynamically simulated states, for example, using mathematical equations and/or look up tables.

In contrast to the embodiment of FIG. 1, the approach in FIG. 2 is based on a non-linear and multivariate model, which provides increased accuracy and the possibility to calculate a large number of KPIs.

In one embodiment, the simulation model 11 is implemented as software with defined input and output interfaces. To this end, the inventive concept may be embodied as a computer program product, that contain instructions, which, when executed by a processor, carries out aspects of the above described simulation method, including: receiving, as input, time series of data points pertaining to a plurality of operational parameters of the electrical energy storage system, using the input time series to simulate dynamics of the electrical energy storage system, and calculating predicted values of a plurality of performance indicators of the electrical energy storage system based on the simulated dynamics of the electrical energy storage system.

The illustrated embodiments thus provide a technique for the prediction of performance factors ("KPIs") of an ESS by using a model that simulates the dynamics of the system and calculates the KPIs based on actual usage. With the illustrated simulation model, more KPIs can be calculated than with state of the art approaches, particularly including those KPIs that depend on usage history in a complicated fashion. In fact, the choice of KPIs may now be potentially only restricted by the possibility to clearly define and implement a measurement protocol for the KPI in question.

Furthermore, with the above-described simulation model based approach, KPIs can be predicted more accurately than with a model free approach or an approach that relies on a simplistic and/or one-on-one relationship between a KPI and lifetime. This enables the supplier to give less conservative and more realistic guarantees. State of the art KPI guarantees might force the customer to use the storage system in very restricted ways. The illustrated model based approach allows any technically sensible usage, since the simulation model will predict the KPIs for potentially all possible usages.

In a further aspect, embodiments of the present invention may be directed to a method for tracking the performance of an ESS. An example of such a method 20 is depicted in FIG. 3. The method 20 may use essentially the earlier illustrated model for calculating predicted values of KPIs for a given time series of operational variables pertaining, for example, to a test usage of the ESS (block 21). The method also includes measuring actual values of the plurality of KPIs from the test usage of the ESS (block 22). The method then involves a comparison (block 23) of the predicted values with the measured values of the respective KPIs. Based on the comparison, it is determined whether the performance of the ESS during the test shows a discrepancy with the predicted or guaranteed performance (block 24), or whether the test performance conforms to the predicted or guaranteed performance (block 25).

In the illustrated embodiment, the comparison (block 23) involves determining a deviation between a predicted value and a measured value for each KPI. Namely, for a KPI 'x', the method involves determining a deviation $\Delta x$ such that:

$$\Delta x = x_{sim} - x_{true} \tag{1}$$

where $x_{sim}$ is the predicted of simulated value of the KPI 'x', and $x_{true}$ is the measured value of the KPI 'x'

For example, if the KPI 'x' is energy capacity, or maximum power, or efficiency, a deviation may be detected if $\Delta x$ is greater than 0 or a predefined threshold value.

In a further embodiment, the method 20 may include determining a cost or a penalty (block 26) associated for each KPI for which a deviation was determined. Herein, for each KPI, a cost or penalty is defined that, for example, has to be paid by the supplier to the consumer in case of a deviation between predicted and actual KPI. This cost or penalty may be a function of the KPI deviation $\Delta x$, i.e.

$$pen_x(t) = f_x(\Delta x(t)) \tag{2}$$

where the function fx provides the cost or penalty for every time step.

The cost or penalty for a time-span from t1 to t2 can then be calculated as:

$$pen_x(t_1, t_2) = \int_{t_1}^{t_2} f_x(\Delta x(t)) dt \tag{3}$$

In the broadest sense, the cost or penalty may be calculated by a "functional" that assigns a cost or penalty directly to the time series of KPI deviations between t1 and t2, i.e:

$$pen_x(t_1, t_2) = \bar{f}_x(\Delta x(t), t_1, t_2) \tag{4}$$

In this case, the overall cost or penalty to be paid by the supplier for a certain time-span t1 to t2 of the project duration is given by:

$$pen(t_1, t_2) = \sum_i pen_{x_i}(t_1, t_2) \qquad (5)$$

The above technique of cost calculation may be useful to an ESS consumer not only for the guarantee purpose, but also, for example, to utilize the simulation model to calculate the operation of the ESS that should result in minimal performance loss or operation cost, as predicted by the guaranteed KPIs. To this end, the operation of the ESS system may be controlled by calculating operating parameters so as to minimize the deviation and/or cost associated with one or more KPIs.

As noted above, in an exemplary embodiment, the simulation model may include size of the ESS as a model parameter. In such a case, using the model and deviation/cost calculations, it may be possible for the consumer to dimension the ESS to that size that will lead to minimized performance deviation and/or cost. The penalties promised by the supplier may, at least partially, compensate the downsides of wrong sizing or operation decisions based by the customer on the guarantee model. This makes it possible to quantify the overall risk for the consumer to base the sizing of his project on the proposed guarantee models.

While specific embodiments have been described in detail, those with ordinary skill in the art will appreciate that various modifications and alternative to those details could be developed in light of the overall teachings of the disclosure. Accordingly, the particular arrangements disclosed are meant to be illustrative only and not limiting as to the scope of the invention, which is to be given the full breadth of the appended claims, and any and all equivalents thereof.

What is claimed is:

1. A method for tracking a performance of an electrical energy storage system, comprising:
   receiving, as input, time series of data points pertaining to a plurality of operational parameters of the electrical energy storage system,
   providing the input time series to a model that simulates dynamics of the electrical energy storage system,
   calculating predicted values of a plurality of performance indicators of the electrical energy storage system based on the simulated dynamics of the electrical energy storage system,
   measuring actual values of said plurality of performance indicators from usage of the electrical energy storage system,
   comparing the predicted values with the measured values of the respective performance indicators to determine any discrepancy in performance of the electrical energy storage system with respect to that predicted by the simulation model,
   for each performance indicator, determining a deviation between a predicted value and a measured value, and
   controlling operation of the electrical energy storage system by calculating operating parameters so as to minimize the deviation associated with one or more performance indicators,
   wherein the plurality of performance indicators are selected from the group consisting of: energy capacity of the electrical energy storage system, losses in use of the electrical energy storage system, efficiency of the electrical energy storage system, and maximum power of the electrical energy storage system.

2. A method for servicing a consumer of an electrical energy storage system, comprising:
   providing a performance guarantee on the electrical energy storage system, wherein the performance guarantee is based on performance indicators predicted by a simulation model of the electrical energy storage system, wherein the simulation model is configured for:
      receiving, as input, time series of data points pertaining to a plurality of operational parameters of the electrical energy storage system,
      using the input time series to simulate dynamics of the electrical energy storage system,
      calculating predicted values of a plurality of performance indicators of the electrical energy storage system based on the simulated dynamics of the electrical energy storage system,
   assessing whether the electrical energy storage system meets a guaranteed performance based on a comparison between a predicted value and a measured value of a performance indicator of the electrical energy storage system,
      wherein the predicted value of the performance indicator is dynamically obtained from the simulation model of the electrical energy storage system,
   wherein the measured value of the performance indicator is obtained from actual usage of the electrical energy storage system,
   assessing a penalty incurred to the consumer if, for any performance indicator, a deviation is determined between a predicted value and a measured value, and
   determining a penalty associated with each of the plurality of performance indicators,
      wherein the penalty associated with each performance indicator is determined as a functional of the deviation for the respective performance indicator,
   wherein the plurality of performance indicators are selected from the group consisting of: energy capacity of the electrical energy storage system, losses in use of the electrical energy storage system, efficiency of the electrical energy storage system, and maximum power of the electrical energy storage system.

* * * * *